(12) United States Patent
Peterson

(10) Patent No.: US 7,893,731 B2
(45) Date of Patent: Feb. 22, 2011

(54) AC/DC INPUT BUFFER

(75) Inventor: Luverne R. Peterson, San Diego, CA (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 142 days.

(21) Appl. No.: 12/273,742

(22) Filed: Nov. 19, 2008

(65) Prior Publication Data

US 2010/0123484 A1    May 20, 2010

(51) Int. Cl.
*H03B 1/00* (2006.01)
*H03K 3/00* (2006.01)

(52) U.S. Cl. .................. 327/108; 327/109; 327/110; 327/111; 327/112; 330/260

(58) Field of Classification Search .................. 327/108; 330/260
See application file for complete search history.

(56) References Cited

U.S. PATENT DOCUMENTS

| 4,293,208 | A | 10/1981 | Bagdis |
| 5,128,560 | A | 7/1992 | Chern et al. |
| 5,532,621 | A | 7/1996 | Kobayashi et al. |
| 5,635,880 | A | 6/1997 | Brown |
| 5,994,939 | A | 11/1999 | Johnson et al. |
| 6,304,149 | B1 | 10/2001 | Kim |
| 6,369,631 | B1 | 4/2002 | Sachdev et al. |
| 6,853,233 | B1 | 2/2005 | Terletzki et al. |
| 7,123,080 | B2 | 10/2006 | Furukawa et al. |
| 7,429,882 | B2 * | 9/2008 | Peterson ...................... 327/108 |

* cited by examiner

*Primary Examiner*—Lincoln Donovan
*Assistant Examiner*—John W Poos
(74) *Attorney, Agent, or Firm*—Tucker Ellis & West LLP

(57) ABSTRACT

A non-inverting AC/DC input buffer combines the desirable characteristics of an alternating current (AC) input buffer including low delay, high speed, and high input voltage swing range with the desirable characteristics of a direct current (DC) input buffer including stability, reliability, and 'automatic' high and low data setup. The AC/DC buffer includes logic to help prevent the DC input buffer from interfering with the AC input buffer until the DC input buffer has completed its operations on a transitioning input. The DC buffer is configured to enable the AC buffer to process low input voltage swings such as, for example, voltage swings less than the difference in power supply voltages.

20 Claims, 9 Drawing Sheets

US 7,893,731 B2

AC/DC INPUT BUFFER

BACKGROUND

The present application relates to general-purpose input buffers and, more particularly, to low voltage signal input buffers.

There are several well-known problems associated with the typical input buffer. A first problem with prior input buffers is the delay through the input buffer. Alternating Current (AC) buffers are generally faster than Direct Current (DC) buffers, but have problems with stability. DC buffers are generally more stable than AC buffers, but their switching speeds are too slow in many applications.

Another problem with prior input buffers is the switching voltage level is typically off center. Still another problem with prior input buffers is their noise immunity with respect to ground is often unacceptable. Furthermore, often a number of prior input buffers are needed in order to handle different low input voltage ranges.

BRIEF SUMMARY OF THE EMBODIMENTS

In an example embodiment, there is disclosed herein an apparatus comprising an input pad for receiving a signal, an alternating current (AC) buffer, a direct current (DC) buffer, an output buffer, a delay circuit, and a DC feedback circuit. The alternating current (AC) buffer has an input and an output, the input being coupled with the input pad. The direct current (DC) buffer has an input and an output, the input being coupled with the input pad. The output buffer has an input coupled with the output of the AC buffer. The delay circuit is coupled with the output of the AC buffer. The DC feedback circuit has a first input coupled with the delay circuit, a second input coupled with the DC buffer, and an output coupled with the output of the AC buffer. The DC feedback circuit provides feedback to the output of the AC buffer based on the input from the DC buffer and the input from the delay circuit.

In another example embodiment, there is disclosed herein an apparatus comprising means for receiving a signal. A means for alternating current (AC) buffering is coupled with the means for receiving, the means for AC buffering having an output. A means for direct current (DC) buffering is also coupled with the means for receiving. A means for inverting the output of the means for AC buffering is coupled with the output of the means for AC buffering. A means for latching the output of the means for AC buffering is coupled with the output of the means for AC buffering. A means for delaying a signal from the output of the means for AC buffering is coupled with the output of the means for AC buffering. A means for providing feedback to the output of the means for AC receives a first input from the means for delaying and a second input from the means for DC buffering is configured to provide feedback based on the first input and the second input.

In a further example embodiment, there is disclosed herein a method comprising applying a signal to an alternating current (AC) buffer, the AC buffer having an output coupled to a node. The method further comprises applying a signal to a direct current (DC) buffer. An output signal is produced based on a signal at the node. The method further comprises latching the node and delaying the signal from the node a predetermined amount of time before applying the signal to a feedback circuit. An output of the DC buffer is applied to the feedback circuit. The feedback circuit applying feedback to the node based on the delayed signal from the node and the output of the DC buffer.

Still other forms and other embodiments will become readily apparent to those skilled in this art from the following description wherein there is shown and described a preferred embodiment, simply by way of illustration of at least one of the best modes best suited to carry out the embodiment. As it will be realized, the examples are capable of other different embodiments and the several details are capable of modification in various obvious aspects all without departing from the scope of the appended claims. Accordingly, the drawings and descriptions are to be regarded as illustrative in nature and not as restrictive.

BRIEF DESCRIPTION OF THE DRAWINGS

The accompanying drawings incorporated in and forming a part of the specification, provide several illustrations of the example embodiments, and together with the descriptions thereof serve to explain the principles of the embodiments.

DETAILED DESCRIPTION OF THE EMBODIMENTS

Throughout this description, the preferred embodiment and examples shown are to be considered examples, rather than limitations. The example embodiments are directed to an AC/DC input buffer having the desirable characteristics of a good AC input buffer including low delay, high speed, and high input voltage swing range together with desirable characteristics of a good DC input buffer including stability and reliability.

Described herein is an input buffer circuit, namely an AC/DC input buffer, provided to quickly and reliably translate a single-ended low voltage swing (e.g. lower than the core voltage) on an input/output (IO) pad to a core voltage level signal with reasonable drive. The example herein describes a non-inverting input buffer that translates 0-volt (low) to 0.4-volt (high) pad input signals to internal voltage signal levels of 0-volts (low) and 1.2-volts (high). The input buffer of the example embodiment also uses the best features of an AC input buffer including low delay and high speed together with best features of a DC input buffer including 'automatic' high and low data set up, input voltage low and high (VIL, VIH) margins. In an example embodiment, the delay through the buffer with a nominal load is about 50 to 100 psec. It is to be appreciated, however, that the delay through the buffer is based in part on the DC current consumption of the buffer. The DC input also advantageously tolerates a variety of input voltage switch ranges. Thus, a single input buffer can be used for various low voltage signal ranges. The circuit implementation fits within a standard IO buffer area and is configured to use standard SCR ESD structure.

Figure 1:
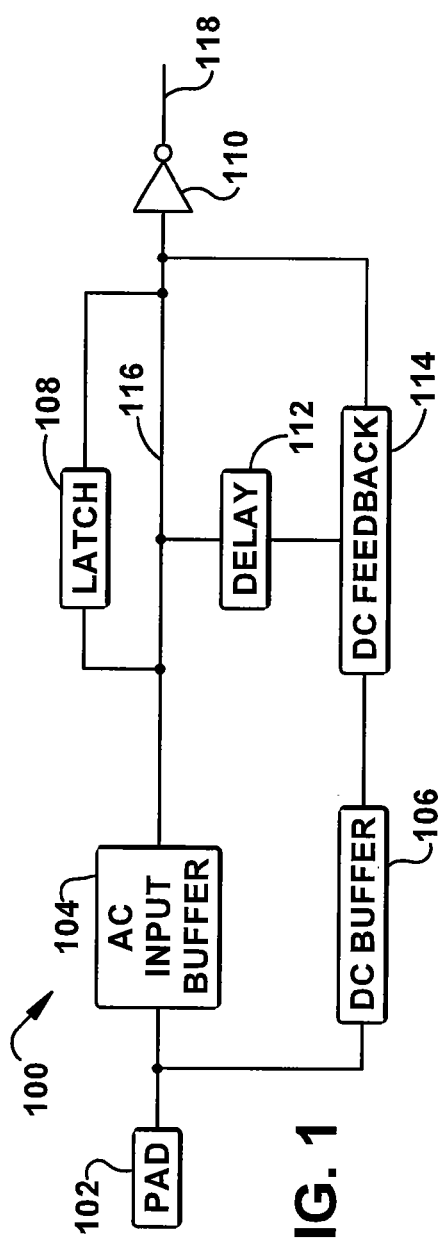
FIG. 1 is a block diagram of an example embodiment.

FIG. 1 is a block diagram of an AC/DC Buffer 100 in accordance with an example embodiment. Buffer 100 receives an input signal on pad 102. The signal is forwarded from pad 102 to AC input buffer 104 and preferably simultaneously to DC Buffer 106. The output of AC input buffer 104 is forwarded to latch 108, delay 112 and output inverter 110. The delayed signal from delay 112 is forwarded to DC feedback circuit 114, which also receives the output from DC buffer 106. The output of DC feedback 114 is coupled to node 116, which is also coupled to the output of AC input buffer 104, latch 108, delay 112 and output inverter 110.

In an example embodiment, AC input buffer 104 comprises a coupling capacitor and an inverter. The AC input buffer is responsive to changes to the signal on pad 102 to quickly change the state at node 116. Because latch 108 resists changes to node 116, AC input buffer 104 is suitably configured to override latch 108. Thus, the output of AC input buffer 104 as acquired at pad 116 is the inverse of the signal at pad 102.

Latch 108 is configured to maintain the voltage at node 116. For example, if node 116 is high, latch 108 will maintain node 116 high. If node 116 is low, latch 108 will maintain node 118 low. As indicated above, AC input buffer is suitably configured to override latch 108, in order for node 116 to change logical states such as for example from a high logical state to a low logical state or from a low to a high logical state.

DC buffer 106 also receives the input signal from pad 102. DC buffer 106 is configured to output a DC voltage corresponding to the voltage at pad 102. DC buffer 106 can be an op amp, pair of inverters or any suitable DC buffer circuit. In an example embodiment, DC buffer 106 response is slower than the response to AC input buffer 104. Delay 112 compensates for this difference.

DC feedback circuit 114 determines from the output of delay 112 and DC buffer 106 whether node 116 is at the appropriate signal level. If node 116 is not at the appropriate signal level, DC feedback circuit applies feedback to node 116 to achieve the appropriate signal level. Because of signal propagation delays, latch 108 may settle in an incorrect state. However, DC feedback circuit 114 stabilizes node 116 and prevents latch 108 from settling in an incorrect state.

Output inverter 110 inverts the signal acquired at node 116. The output 118 is the inverse of the signal at node 116.

In operation, at steady state, the signal at node 116 is the inverse of the signal of pad 102, which is the inverse of the output of DC buffer 106. When the signal changes at pad 102, AC input buffer quickly switched node 116 (e.g. from high to low). AC input buffer is sufficient to override latch 108. As the signal at node 116 switches (e.g. from low to high), output buffer 110 changes the signal at output 118 (e.g. from high to low).

The signal from pad 102 is also provided to DC buffer 106. The change of signal at node 116 (e.g. from low to high) is provided to DC feedback circuit after a preset delay by delay circuit 112. In an example embodiment, the signal change propagates through pad 112 concurrently with the change in voltage by DC buffer 106. Because AC input buffer 104 is not as stable as DC input buffer 106, DC feedback circuit 114 maintains the signal at node 116 based on the signal received from delay 112 and DC buffer 106. Latch 108 will also change stages responsive to the change of signal at node 116. DC feedback circuit 114 maintains the voltage at node 116 so that the input at latch 108 does not change and allows latch 108 sufficient time to change to latch the new (e.g. high) voltage at node 116. Once latch 108 is stabilized, DC feedback circuit 114 no longer has to provide feedback to node 116, until the signal at pad 102 changes.

Figure 2:
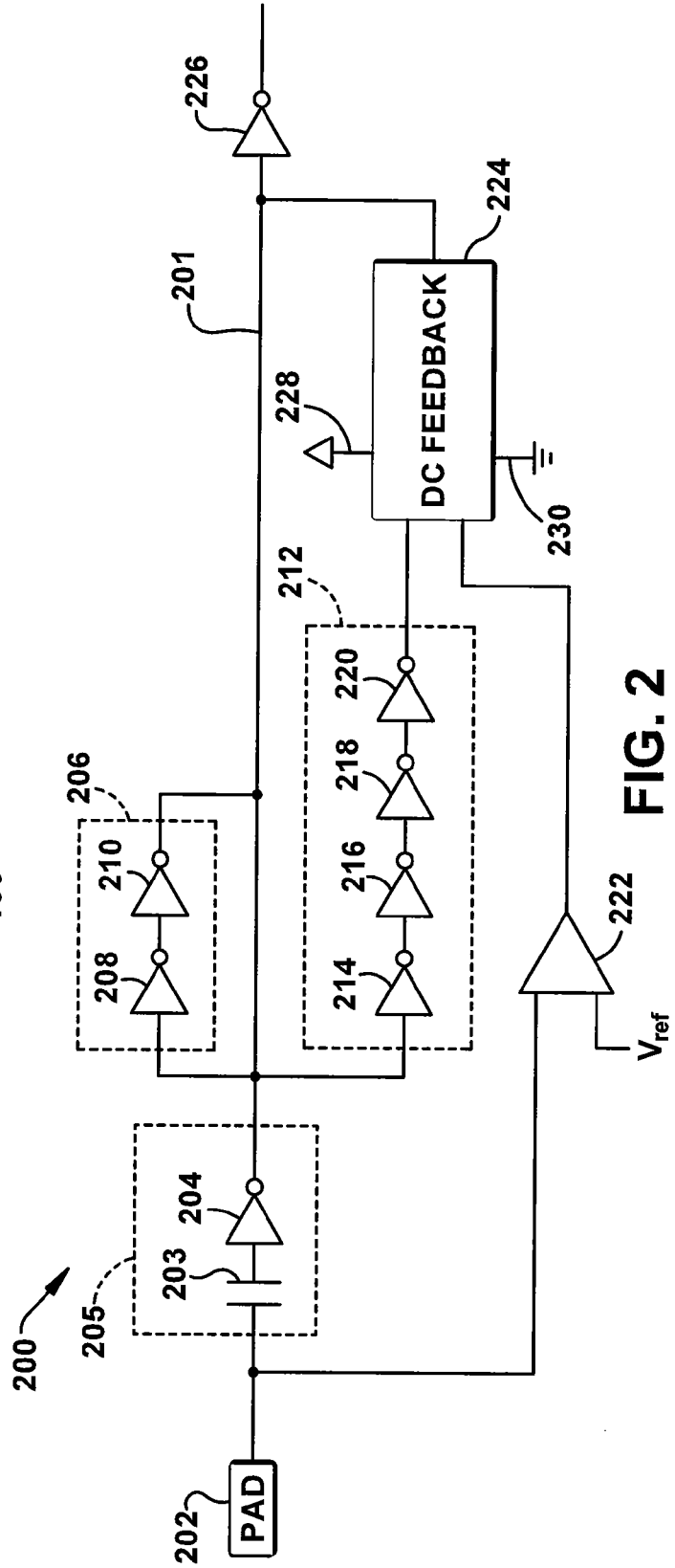
FIG. 2 illustrates an example schematic diagram of an example embodiment.

FIG. 2 illustrates an example schematic diagram of an example embodiment of an AC/DC buffer 200. Buffer 200 comprises a pad 202 for receiving an input signal. Pad 202 is coupled with a capacitor 203 in series with an input inverter 204 and is further coupled with an op amp 222. In the example embodiment, the capacitor 203 and inverter 204 comprise an AC input buffer 205. The negative (−) input of Op amp 222 is coupled to a reference voltage (VREF). In operation, signals above VREF will cause op amp 222 to output a signal at a first state (e.g. a high state) while signals below VREF will cause op amp 222 to output a signal at a second state (e.g. a low state).

The output of inverter buffer 204 of the AC input buffer 205 is coupled to node 201. Node 201 is coupled to latch 206. As illustrated, latch 206 comprises two inverters 208, 210 in series. Latch 206 operates to try to match the output of inverter 210 with the input of inverter 208. If node 201 changes while the signal is propagating from the input of inverter 208 to the output of 208, latch 206 can latch to an incorrect state. As will be explained herein, DC feedback circuit 224 can prevent node 201 from changing for a predetermined time period.

Node 201 is also coupled to delay 212. Delay 212 comprises four inverters 214, 216, 218, 220. The output of inverter 220 will be equal to the input of inverter 214 once the signal has propagated through inverters 214, 216, 218, 220. The output of delay 212 is provided to an input of DC feedback circuit 224. DC feedback circuit is also coupled to the output of op amp 222. In an example embodiment, DC feedback circuit 224 functions as a switch. DC feedback circuit 224 may couple node 201 to a first signal (e.g. supply voltage signal VDD) 228, a second signal (e.g. ground) 230, or no signal depending on the inputs received from delay circuit 212 and op amp 222. In an example embodiment, the delay from pad 202 through inverter 204 and delay 212 is approximately equal to the delay from pad 202 to the output of op amp 222. Because in this example embodiment op amp 222 is non-inverting, and input inverter 204 is inverting, the output from delay 212 should not equal the output from op amp 222. If the signal from delay 212 is equal to the output of op amp 222, feedback circuit 224 switches either the first signal 228 or second signal 230. After node 201 changes responsive to the signal provided by feedback circuit 224, the output from delay 212 should change once the change at node 201 has propagated through inverters 214, 218, 218, 220.

Output inverter 226 is coupled to node 201. By enabling input inverter 204 to change node 201 faster than can be accomplished by op amp 222, this enables output inverter 226 to begin switching faster. DC feedback circuit 224 prevents node 201 from changing back to the original value until latch 206 has had sufficient time to latch the changed signal at node 201. Thus, output inverter 226 can switch faster due to the AC input, and be stabilized until the DC input switches.

Figure 3:
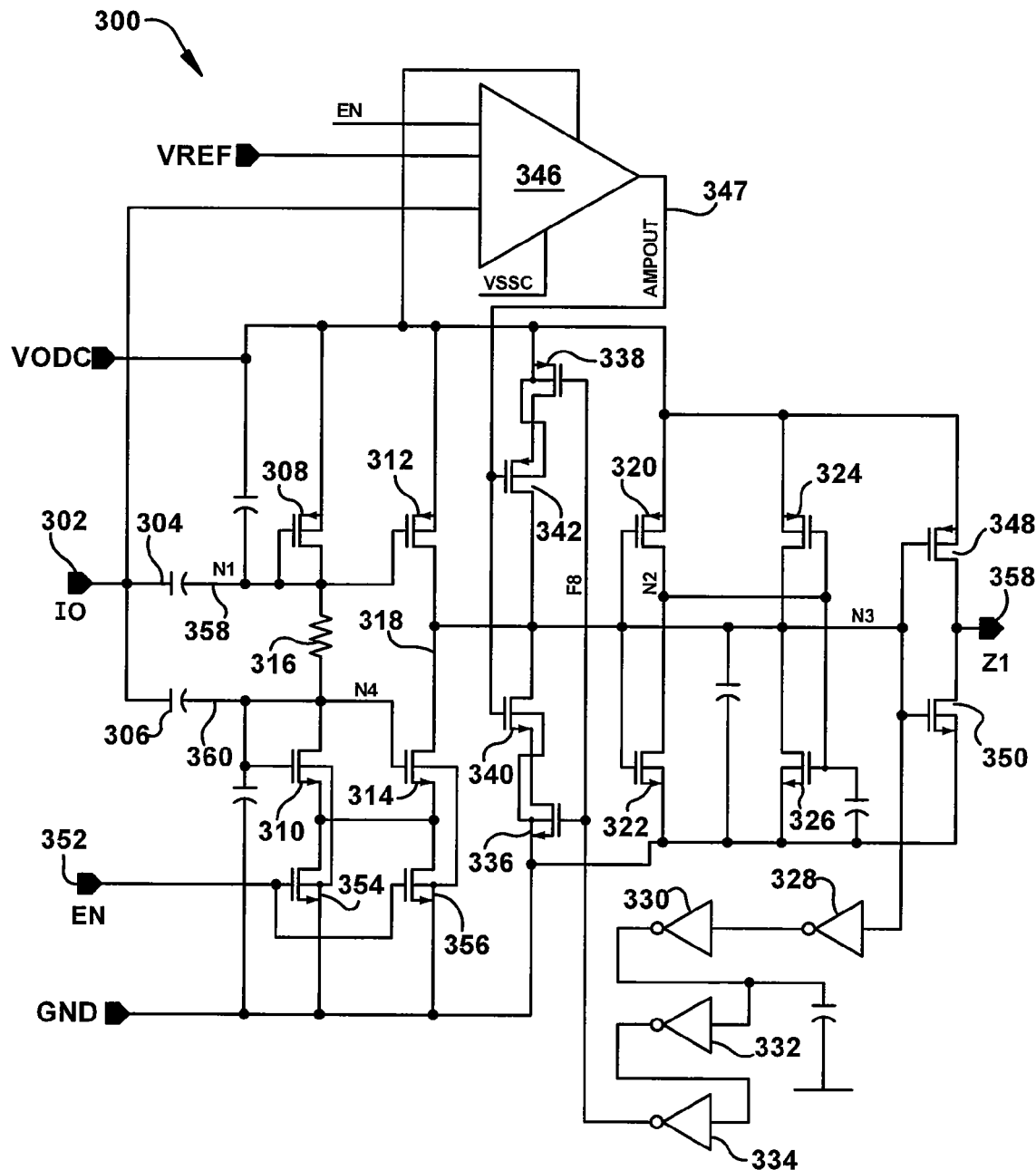
FIG. 3 is a circuit diagram of an example embodiment.

Referring to FIG. 3, there is illustrated a detailed example of an AC/DC buffer 300. Buffer 300 is suitably adapted to perform the functionality of buffer 100 (FIG. 1) and/or buffer 200 (FIG. 2). An input/output (IO) pad node 302 receives the input signal. The IO pad node 302 provides the input signal to the DC input circuit and the AC input circuit. Table 1 below illustrates the relationship between inputs and outputs for circuit 300:

TABLE 1

| INPUT (IO) 302 | ENABLE (EN) 352 | OUTPUT (ZI) 358 |
| --- | --- | --- |
| L | H | L |
| H | H | H |
| X | L | L |

The AC input circuit comprises capacitors 304, 306, transistors 308, 310, 312, 314, and resistor 316. The output of the AC input circuit is node 318. The signal from pad 302 is forwarded to capacitors 304 and 306. In an example embodiment, capacitors 304, 306 have a larger capacitance than the combined transistor gate, diffusion and parasitic capacitances at their output nodes, 358, and 360 respectively. The p-transistor 308 and the n-transistor 310 have their gates and sources connected to nodes 358, 360 respectively and nodes 358 and 360 are coupled by resistor 316.

In an example embodiment, both transistors 310 and 308 are biased so they are slightly on (conducting). The degree that the transistors are conducting is determined by the value of resistor 316. Transistors 308, 310, are operating like diodes; therefore, the larger the value of resistor 316, the lower the current through transistors 308, 310. For example, when a high signal is input to PAD 304, transistor 308 will be reversed bias and shut off, while transistor 310 will be forward biased and conducts more current than in steady state. When a low signal is input to PAD 304, transistor 308 will be forward biased and conducting more current than in steady state while transistor 310 will be reverse biased.

The output stage of the AC input buffer comprises transistors 312, 314. Transistors 312, 314 are coupled to node 318 function like an inverter. When IO pad 302 receives a high signal, transistor 314 switches on, driving node 318 low. When IO pad 302 receives a low signal, transistor 312 switches on, driving node 318 high.

A latch is also coupled to node 318. The latch comprises two inverter stages coupled in series. The first inverter stage is formed by transistors 320, 322 and the second inverter stage is formed by transistors 324, 326. The latch functions to hold the voltage at node 318. In an example embodiment, the sizes of transistors 312, 314 are selected in order to overdrive the latch transistors. Thus, for example, when the input at IO pad 302 switches low, transistors 312, 314 are sufficient to overdrive the latch to switch node 318 to high. In an example embodiment, the widths of transistors 312, 314 are six times the width of transistors 308, 310. In an example embodiment, the width of transistors 312, 314 are also six times the width of transistors 320, 322, 324, 326.

The output stage is also coupled to node 318. The output stage comprises transistors 348, 350, which form an inverter. The output (ZI) at node 358 of the inverter 348, 350 is, essentially, node 318 inverted.

The DC input circuit is also coupled to IO pad 302. The DC circuit comprises op Amp 346. In an example embodiment, op amp 346 is an inverting comparator op amp that amplifies the low voltage input to the core voltage level. This accomplished with the aid of a reference voltage (VREF) on an input of the op amp 346. For example, for a 0.4 volt input signal swing, the reference voltage (VREF) is 0.2-volts (½ the input signal high voltage). Op amp 346 is powered by the core power supply (VDDC), which in this example embodiment is 1.2-volt voltage.

Figure 4:
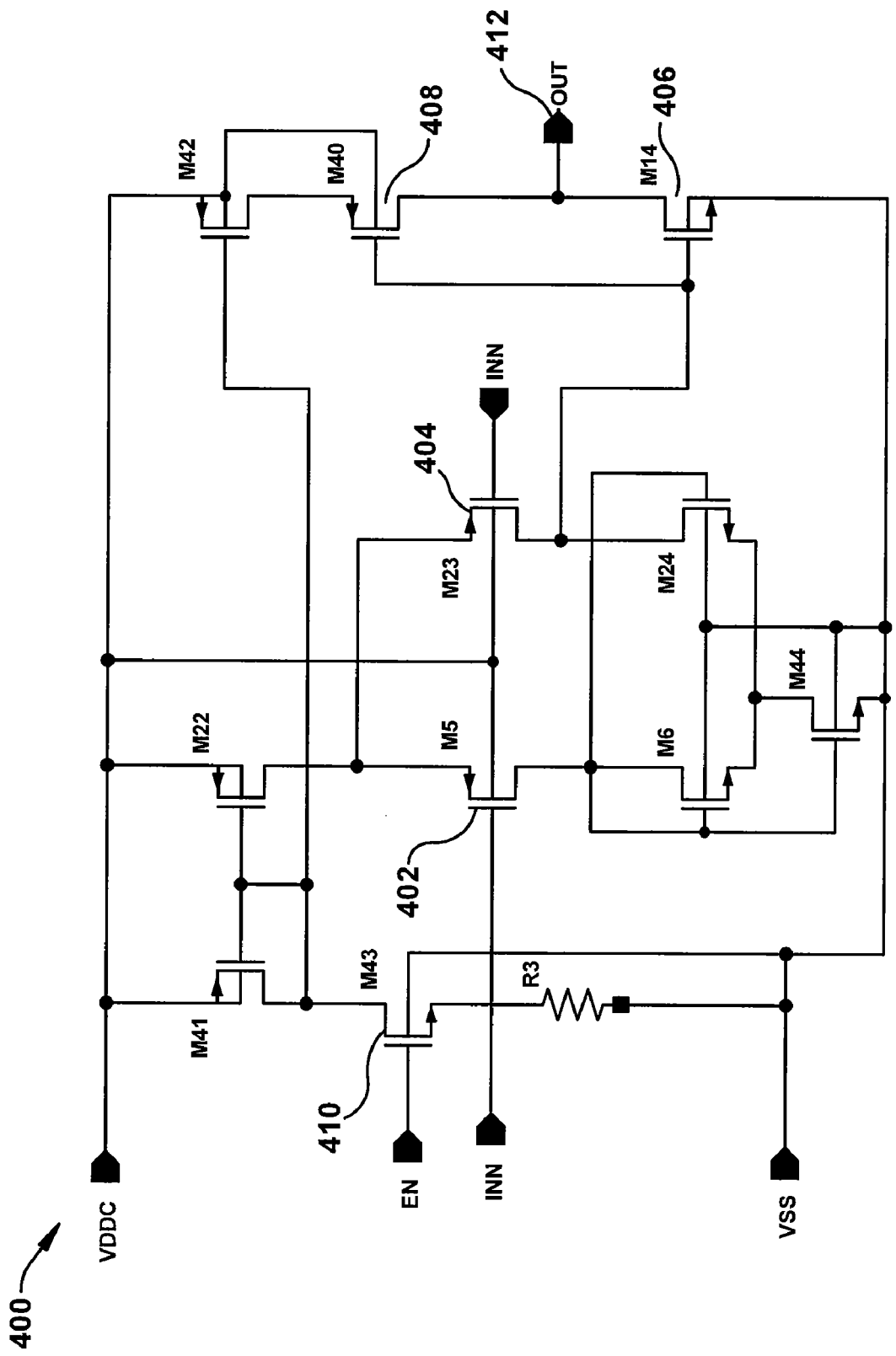
FIG. 4 illustrates an example of an op amp suitable for an example embodiment.

Op amp 346 has an enable (EN) input signal line that can be used to disable the op amp. In an example embodiment, if EN is low the DC current through the op amp 346 is eliminated and the output of op amp 346 is low. FIG. 4 provides a more detailed description of an example op amp.

In the illustrated example embodiment, op amp 346 consumes a small amount of DC power—about 120 uWatt, and is relatively slow when compared to the AC input. The output 347 of op amp 346 is fed to the gates of transistors 342 and 340 of the DC feedback circuit, the DC feedback circuit comprises n-transistors 340, 336 and p-transistors 338, 342.

Node 318 is also input into a delay inverter chain, formed by inverters 328, 330, 332, 334. The output of the delay inverter chain provides an input into the gates of transistors 336 and 338. In an example embodiment, the feedback circuit is designed so that the switching signal propagation delay from input IO pad 302 to the gates of transistors 336, 338 is approximately equal to the switching signal propagation delay from input IO pad 302 to the output 347 of op amp 346. With this timing the DC portion of the circuit doesn't interfere (e.g. cause increased delay, latch instability or latch settling in an incorrect state) with the fast AC portion of the circuit.

The feedback circuit insures that if there is a high/low on IO pad 302, there will be a high/low at signal ZI on output pin 358. However in the example embodiment, because the AC input buffer functions as an inverter, node 318 is the opposite (e.g. low/high) of pad 302. Because the AC input is inverting, whereas the output 347 of op amp 346 is non-inverting, node 318 and output 347 should not match. Thus, if both output 347 and node 318 are low, transistors 338 and 342 will switch on to drive node 318 high. If both output 347 and node 318 are high, transistors 336 and 340 will switch on and drive node 318 low. If output 347 and node 318 are the opposite of each other (e.g. one is high while the other is low) then one of transistors 338, 342 will be switched off, and one of transistors 336, 340 will be switched off; and node 318 will not be changed.

For example, there is a high on IO pad 302 and a low on ZI pin 358, then node 318 is also high (when it should be low). If the node 318 is high then n-transistor 336 will switch on (after propagating through delay buffers 328, 330, 332, and 334). The high on the IO pad will result in a high on the output 347 of node turning on n-transistor 340. Thus, because both transistors 336 and 340 are switched on, node 318 will be driven low, causing output signal ZI at output pin 358 to transition to a high state matching IO pad 302. In an example embodiment, this should all take place in about 200 psec to 400 psec. When node 318 transitions to a low state, the low signal is propagated through delay buffers 328, 330, 332 and 334 (e.g. after about 300 psec) the signal to the gate of transistor 336 will transition to a low state, switching transistor 336 off.

As another example, if there is a low on IO pad 302 and a high on output signal ZI at output pin 358, then node 318 is low when it should be high. Because output 347 is low, p-transistor 342 will be conducting. When node 318 is low (after the delay), p-transistor 338 is conducting. When both transistors 338 and 342 are conducting, node 318 is driven high. Once node 318 is high, the signal to the gate of p-transistor 338 will be driven high after the delay caused by delay buffers 328, 330, 332, 334. Once the signal at the gate of transistor 338 is high, then transistor 338 switches off.

The feedback circuit increases stability by inhibiting oscillation In an example embodiment, the delay through inverters 328, 330, 332, 334 is greater than the amount of time for the latch to achieve steady state. Thus, when either transistor 338 or 336 switch off, the latch will maintain node 318 at the correct level.

AC/DC buffer 300 also comprises an enable circuit. The enable circuit comprises enable pad (EN) 352 that is coupled to the gates of transistors 354 and 356. When the enable signal EN at pad 352 is high, transistors 354 and 356 are on. When the enable signal EN at pad 352 is low, transistors 354 and 356 are off, and no current flows through transistors 310 and 314.

Although FIG. 3 as illustrated employs CMOS transistors. This is merely for ease of illustration and should not be construed as limiting the example embodiments as those skilled in the art should readily appreciate that any controllable switching device that provides the desired functionality can be employed.

FIG. 4 illustrates an example of an op amp 400 suitable for an example embodiment. Op amp 400 is suitable to perform the functionality of op amp 346 (FIG. 3) and/or op amp 222 (FIG. 2). Op amp comprises a differential input stage. The differential input stage comprises transistors 402 and 404. The positive input (INP) signal of op amp 500 is coupled to transistor 404. The negative input (INN) signal of op amp 500 is coupled to transistor 402. The differential input stage is coupled to an output stage comprising transistors 406, 408. The output of op amp 400 is acquired at OUT pin 412. In operation, a reference voltage is coupled to the negative input (INN) coupled to transistor 402. When the voltage at the positive input (INP) coupled to transistor 404 is less than VREF, then transistor 406 is conducting and OUT 412 is low. When the voltage at the positive input (INP) coupled to transistor 404 is greater than VREF, then transistor 406 is off and OUT 412 is high.

Op amp 400 also comprises an enable (EN) input signal coupled to transistor 410. When enable is asserted (high) transistor 410 is conducting and op amp 400 is operating. When enable is low, transistor 410 is off, cutting off DC current to op amp 400 and the output of op amp 400 is low.

Figure 5:
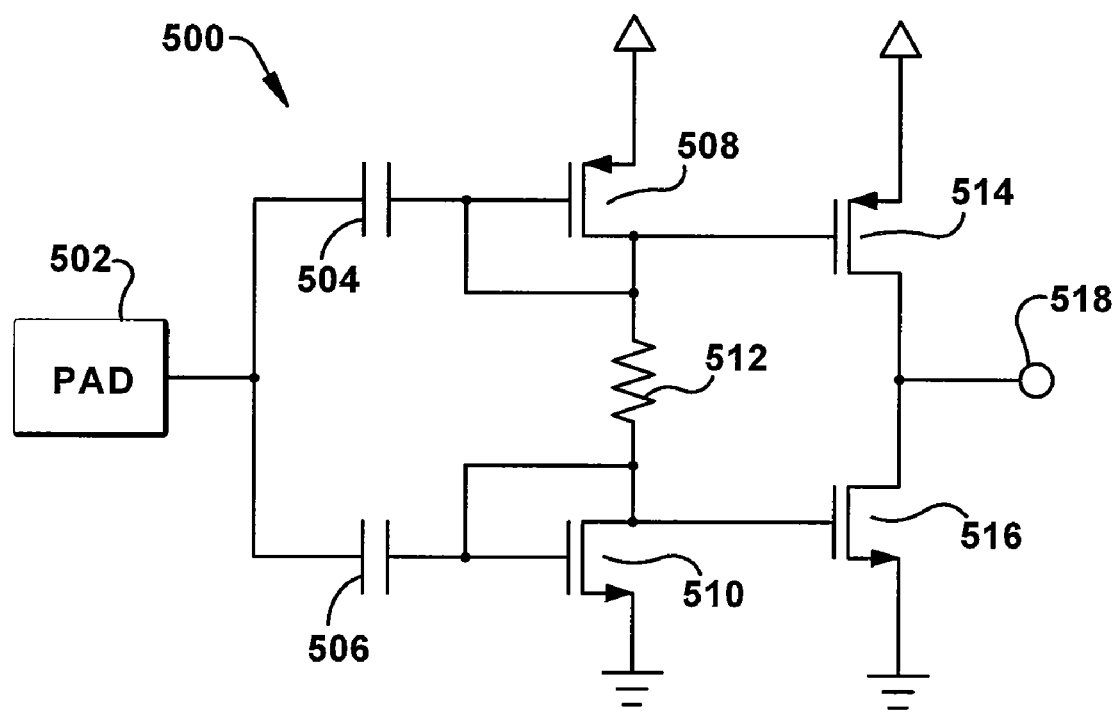
FIG. 5 is a circuit diagram of an AC input buffer suitable for an example embodiment.

FIG. 5 is a circuit diagram of an AC input buffer 500 suitable for an example embodiment. Coupling capacitors 504, 506 couple transistors 508 and 510 to pad 502 respectively. A resistor 512 is coupled between transistors 508 and 510. Transistors 514, 518 form an inverter. The gate of transistor 514 is coupled to transistor 508 and the gate of transistor 516 is coupled to transistor 510. The output is acquired from node 518.

In DC operation, capacitors 504, 506 block input pad 502 from transistors 508, 510, which operate as diodes, passing current from transistor 508, through resistor 512 and transistor 510.

When pad 502 switched from low to high, the switching voltage is passed through capacitors 504, 506 to the gates of transistors 508, 510 respectively. This causes transistor 514 to become reversed bias and turns off; however, transistor 516 is increasingly forward biased and thus conducts more current. This causes node 518 to go low.

When pad 502 switched from high to low, the switching voltage is passed through capacitors 504, 506 to the gates of transistors 508, 510 respectively. This causes 514 to become increasingly forwards biased; however, transistor 516 becomes reversed bias and switches off. This causes node 518 to go high.

The widths of transistors 514, 516 can be selected to enable them to override devices coupled to node 518. For example, in circuit 300 illustrated in FIG. 3, the widths of transistors 514, 516 can be selected to be six times the width of transistors 324, 326 so that transistors 514, 516 can overdrive transistors 324, 326.

Figure 6:
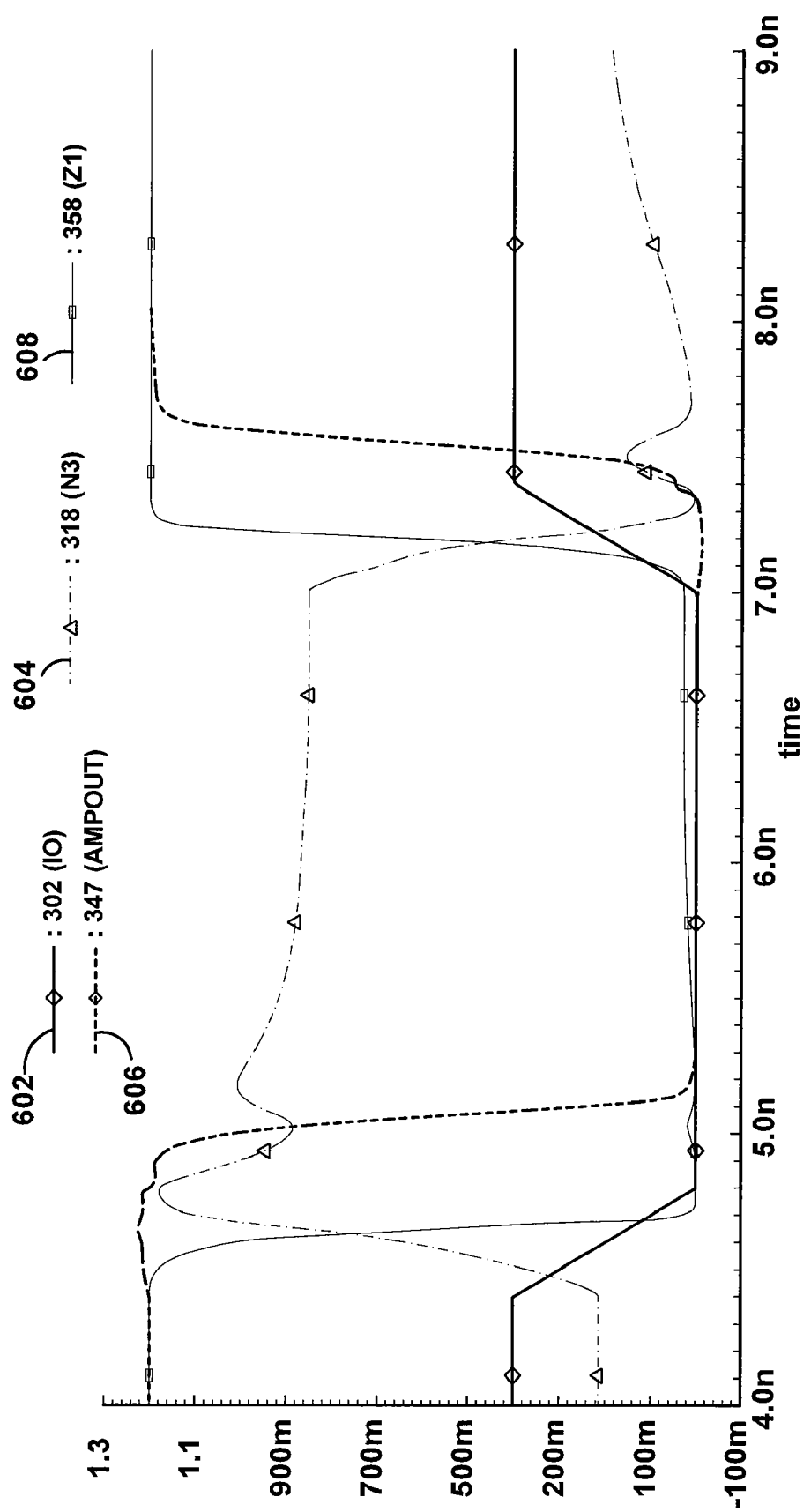
FIG. 6 is a chart showing signal diagrams of an example embodiment.
Figure 7:
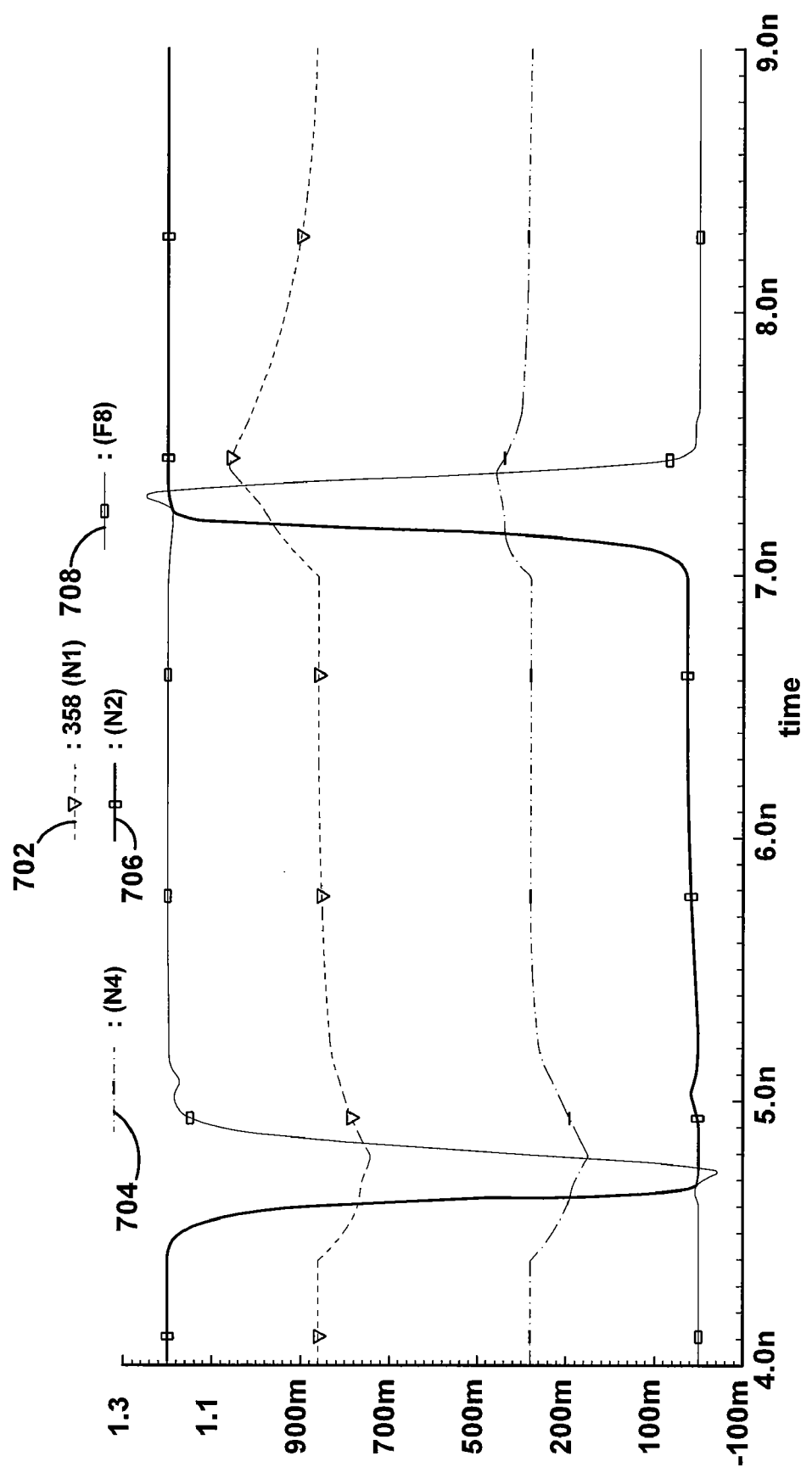
FIG. 7 is another chart showing signal diagrams of an example embodiment.

FIGS. 6 and 7 are charts illustrating example signal diagrams for an example embodiment. The signal diagrams illustrate an example of the circuit 300 of FIG. 3, where the signal at IO pad 302 transitions from high to low, then from low to high; VDD is 1.2 volts, and the desired input signal swing is 0.4 volts. Signal 602 illustrates the signal input at IO pad 302. Signal 604 illustrates a signal at node 318. Signal 606 illustrates the signal at the output 347 of op amp 346. Signal 608 illustrates the output of the buffer ZI 358. Signal 702 illustrates the output of capacitor 304 (the input to the gate of transistor 308). Signal 704 illustrates the output of capacitor 306 (the input to the gate of transistor 310). Signal 706 is the signal at the output of the first stage of the latch, which is the input to gates of transistors 324, 326. Signal 708 is the output of delay buffer 334, which is input to the gates of transistors 336 and 338.

At the start of the example, (the quiescent 'high' state) the voltage 604 at IO node 302 is high (0.4 v) and the voltage 608 at output ZI 358 is high (1.2 v). Node 318 (signal 604) is 'low' at about 150 mv (this node will never be completely high or low since the transistors 312 and 314 are both slightly on in both the quiescent high and low states). Node 358's voltage 702 is about 0.85 v and node 360 voltage 704 is about 0.36 v. The signal 347 voltage 606 is high and the voltage 708 at the output of delay inverter 708 is low. When IO pad node voltage 602 goes low the voltages 702, 704 on nodes 358, 360 respectively drop to about 150 mv lower than the quiescent voltages. These voltage drops turn n-transistor 314 off and p-transistor 312 on harder. There is sufficient current through transistor 312 to overdrive the feedback latch pulldown n-transistor 326 causing voltage 604 to rise and ZI 608 to fall. As ZI 608 falls so does the feedback latch node voltage 706 keeping the voltage 604 on node 318 at a quiescent high voltage of about 0.85 v (a good enough high). About 200 psec after node 318 voltage 604 switches high, the output voltage 708 of inverter 334 switches high and almost immediately the signal 347 node voltage 606 switches low.

When the IO pad 302 node voltage 602 goes high the voltages 702, 704 on nodes 358 and 360 respectively go about 150 mv higher than their quiescent voltages. The 702 and 704 voltage rises, turning n-transistor 314 on harder and p-transistor 312 off. There is sufficient current through transistor 314 to overdrive the feedback latch pullup p-transistor 324 causing node 318 voltage 604 to fall and ZI voltage 608 to rise. As the ZI output voltage 608 rises so does the feedback latch node voltage 706, returning the voltage 604 on 318 to a quiescent low of about 0.15 v. About 200 psec after node 318 voltage 604 switches low, voltage 708 switches low and almost immediately the signal 347 node voltage 606 switches high. In the example embodiment, the DC power consumption of the circuit is about 200 ua.

Figure 8:
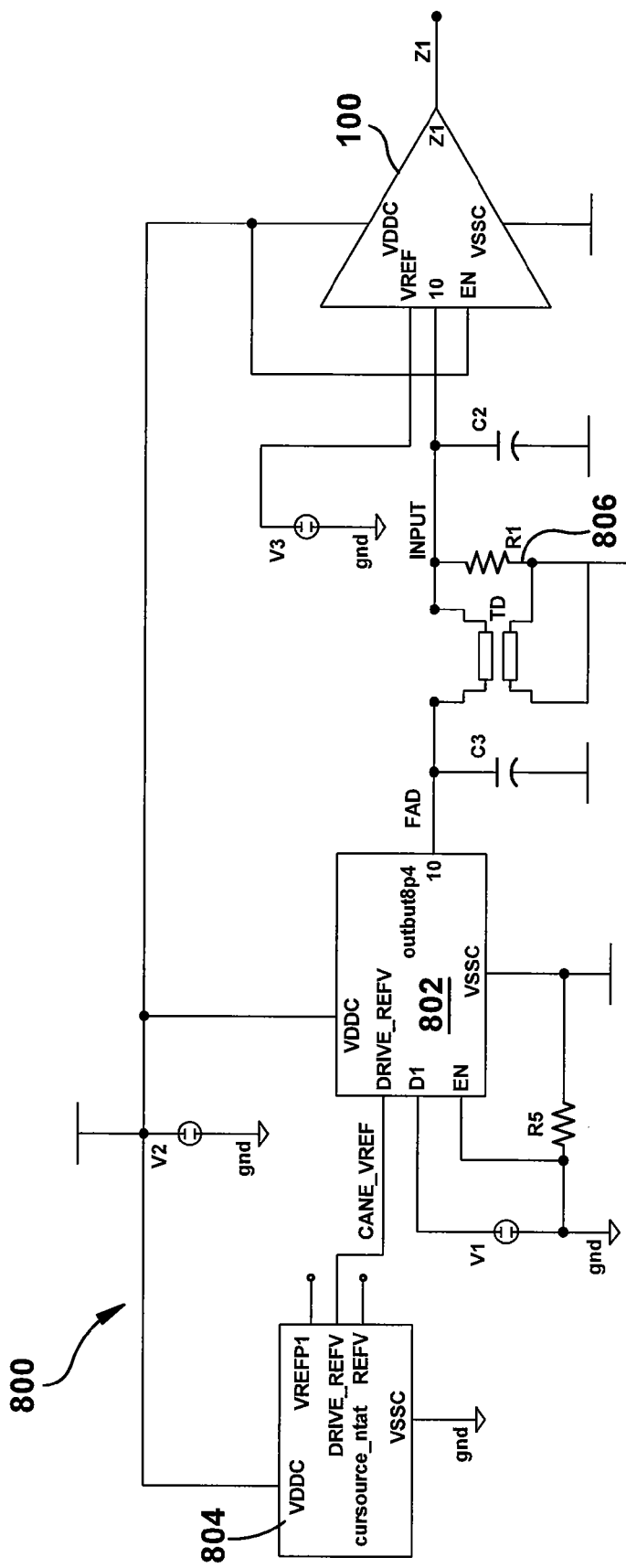
FIG. 8 is a circuit diagram of an output buffer for driving the AC/DC input buffer.

FIG. 8 illustrates an example embodiment 800 of a 0.4-volt output buffer 802 that drives AC/DC input buffer 100 (FIG. 1; or may also drive buffer 200, FIG. 2 or buffer 300, FIG. 3). In the example embodiment 800, an accurate current source 804 generates a reference current such that the voltage across the 100-ohm termination resistor 806 to ground is about 400 mv when output buffer 802 outputs a 'high" signal.

Figure 9:
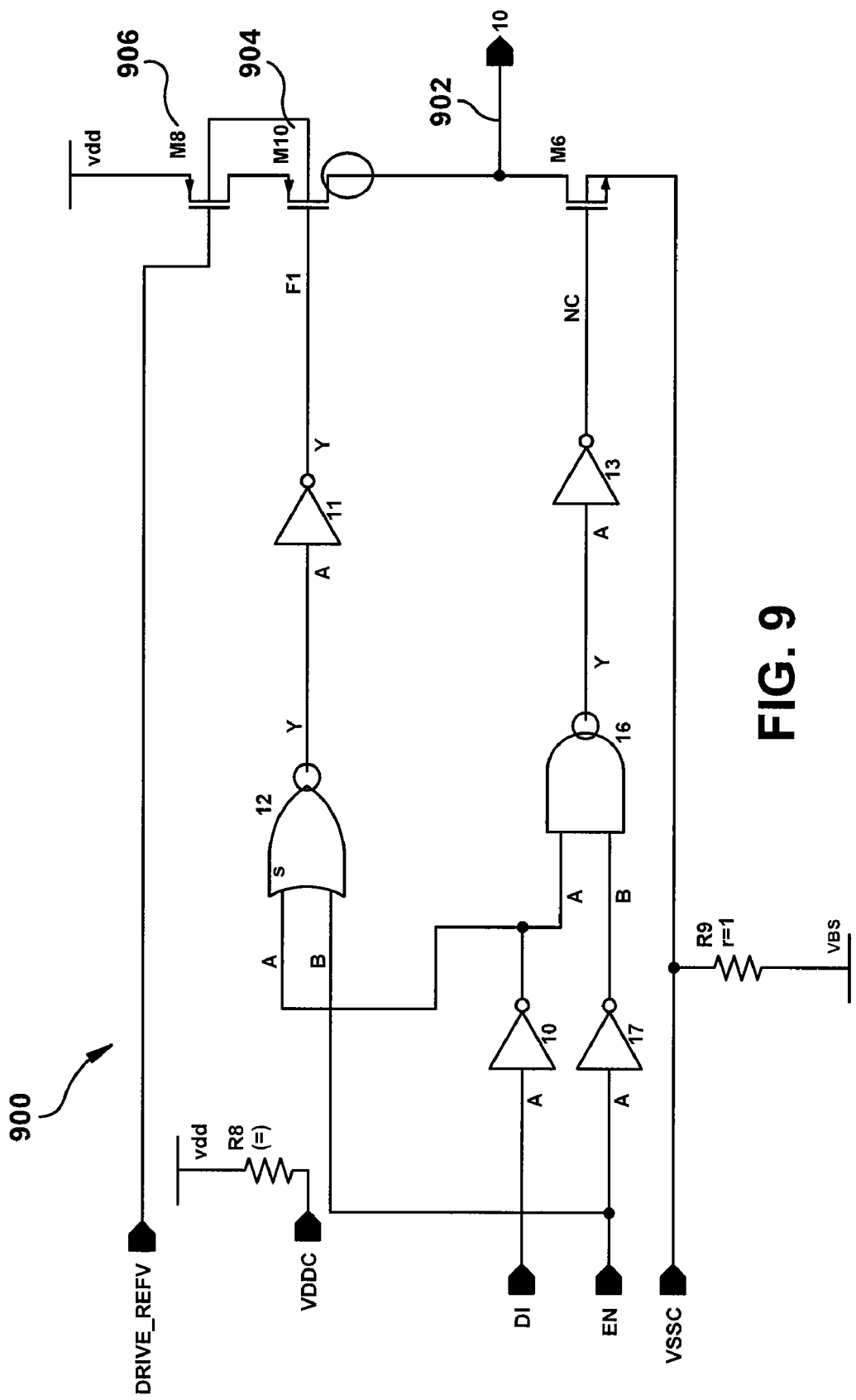
FIG. 9 is a circuit diagram of a portion of the output buffer of FIG. 8.

FIG. 9 illustrates a detailed circuit 900 of an output buffer suitable for output buffer 802. The example output buffer circuit 802 illustrated in FIG. 9 is a tristate output buffer where the output of pull-up transistor 904 is in series with a 4 ma current control transistor 906. When transistor 904 is turned on a 4 ma current flows through the 100-ohm resistor raising the voltage at the input to the input buffer to about 400 mv.

Figure 10:
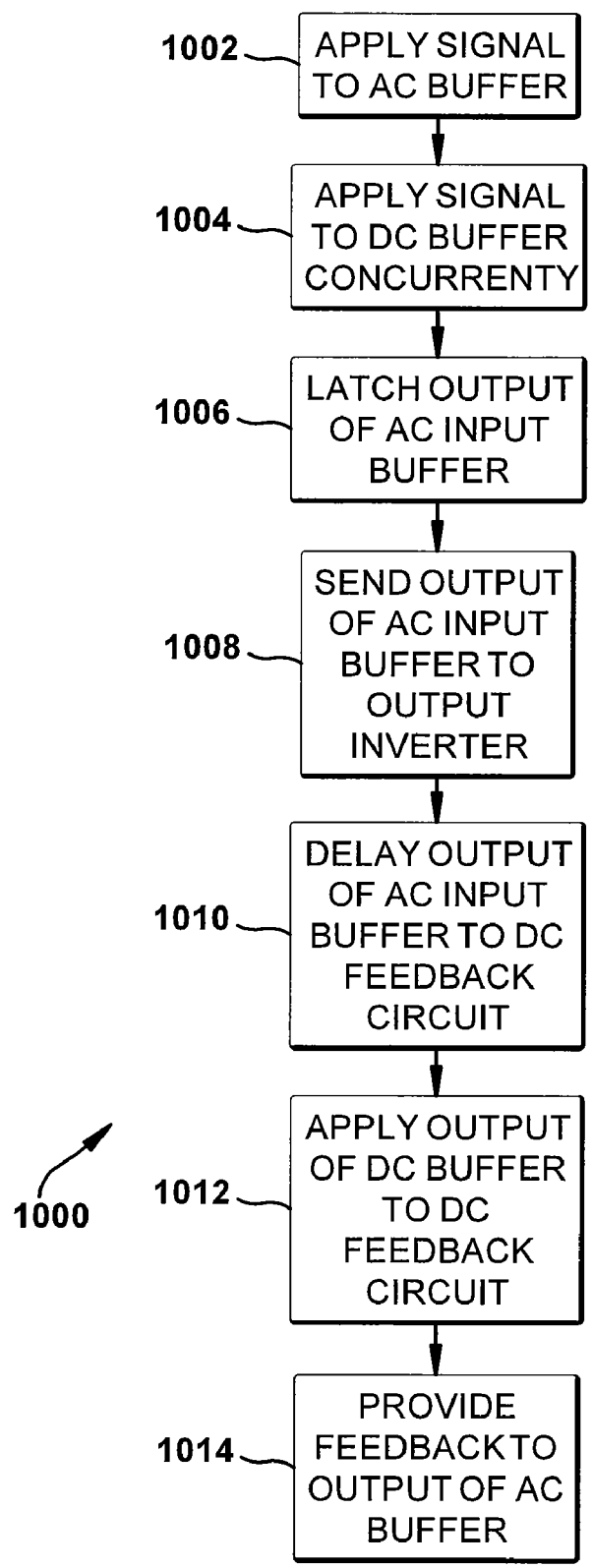
FIG. 10 is a flow diagram illustrating an example embodiment.

In view of the foregoing structural and functional features described above, a method 1000 in accordance with an example embodiment will be better appreciated with reference to FIG.10. While, for purposes of simplicity of explanation, the method 1000 of FIG. 10 is shown and described as executing serially, it is to be understood and appreciated that the example embodiment is not limited by the illustrated order, as some aspects could occur in different orders and/or concurrently with other aspects from that shown and described herein. Moreover, not all illustrated features may be required to implement method 1000.

At 1002, a signal is applied to an AC buffer. In an example embodiment, the signal is received at an input pad and forwarded to the AC buffer. The AC buffer passes changes in the input signal, as opposed to a DC buffer, which holds the value of the signal at the input.

At 1004, the signal is applied to a DC buffer. The signal can be applied to the DC buffer concurrently to the signal being applied to the AC buffer. The DC buffer maintains its output to match the value at the input (e.g. the pad value). As the signal is applied to the DC buffer, the DC buffer begins to change to match the input signal.

At 1006, the output of the AC buffer is latched. Because a latch tends to prevent changes, the AC buffer has sufficient capacity to change its output and override the latch when a new signal is applied.

At 1008, the output of the AC buffer is provided to an output inverter. If the AC buffer is an inverting buffer, then the signal at the output of the output inverter will match the input signal. Because an AC buffer tends to change states faster than a DC buffer, this enables the output invert to begin switching responsive to the input signal faster.

At 1010, the output of the AC buffer is delayed by a predetermined amount of time before being provided to a DC feedback circuit. For example, the delay circuit may suitably comprise a plurality of inverters in series; the amount of delay can be determined by the number of inverters.

At 1012, the output of the DC buffer is applied to the DC feedback circuit. At 1014, feedback is provided to the output of the AC buffer. The feedback is based on the delayed output of the AC buffer and the output of the DC buffer. In an example embodiment, the AC buffer is inverting while the DC buffer is non-inverting, so the feedback circuit provides feedback to adjust the output of the AC buffer when the output of the DC buffer matches the output of the AC buffer. This stabilizes the circuit and prevents the latch from oscillating.

The invention claimed is:

1. An apparatus, comprising:
   an input pad for receiving a signal;
   an alternating current (AC) buffer having an input and an output, the input is coupled to the input pad;
   a direct current (DC) buffer having an input and an output, the input is coupled to the input pad;
   an output buffer having an input coupled to the output of the AC buffer;
   a delay circuit coupled to the output of the AC buffer; and
   a DC feedback circuit having a first input coupled to the delay circuit, a second input coupled to the DC buffer and an output coupled to the output of the AC buffer;
   wherein the DC feedback circuit provides feedback to the output of the AC buffer based on the input from the DC buffer and the input from the delay circuit.

2. The apparatus according to claim 1, wherein the AC buffer is an inverting buffer and the output buffer is an inverting buffer.

3. The apparatus according to claim 1, wherein the DC buffer comprises an operational amplifier (op amp).

4. The apparatus according to claim 1, wherein the delay circuit comprises a plurality of inverters coupled in series.

5. The apparatus according to claim 1, wherein the delay circuit comprises four inverters coupled in series.

6. The apparatus according to claim 1, wherein the feedback circuit provides feedback to the output of the AC buffer when the input from the delay matches the input from the DC buffer.

7. The apparatus according to claim 6, wherein the feedback provided by the DC feedback circuit to the output of the AC buffer is the inverse of the input from the DC buffer.

8. The apparatus according to claim 6, wherein the DC feedback circuit couples the output of the AC buffer to a high signal responsive to receiving a low signal from the delay input and a low signal from the DC buffer.

9. The apparatus according to claim 6, wherein the DC feedback circuit couples the output of the AC buffer to a low signal responsive to receiving a high signal from the delay input and a high signal from the DC buffer.

10. The apparatus according to claim 6, wherein the DC feedback circuit comprises a controllable switching device and
   wherein the controllable switching device switches to a non-conducting state responsive to the input from the delay not matching the input from the DC buffer.

11. The apparatus according to claim 1, further comprising a latch coupled to the output of the AC buffer.

12. The apparatus according to claim 11, wherein the AC buffer is configured to override the latch responsive to the signal at the input pad changing.

13. The apparatus according to claim 12, the AC buffer further comprises:
   first and second controllable switching devices coupled in cascode;
   a resistor coupled between the first and second controllable switching devices; and
   third and fourth controllable switching devices coupled in cascode;
   wherein the gate of the third controllable switching device is coupled to a node between the resistor and the first controllable switching device; and
   wherein the gate of the fourth controllable switching device is coupled to a node between the resistor and the second controllable switching device.

14. The apparatus according to claim 13, wherein the first, second, third and fourth controllable switching devices are biased to be in a first conducting state at steady state.

15. The apparatus according to claim 14, wherein the first and third controllable switching devices switch off and the second and fourth controllable switching devices switch to a second conducting state that conducts more current than the first conducting state responsive to the signal at the input pad switching from a low signal to a high signal.

16. The apparatus according to claim 15, wherein the first and third controllable switching devices switch to the second conducting state and the second and fourth controllable switching devices switch off responsive to the signal at the input pad switching from a high signal to a low signal.

17. The apparatus according to claim 16, wherein the third and fourth controllable switching devices are wider than the first and second controllable switching devices.

18. The apparatus according to claim 16, wherein the third and fourth controllable switching devices are six times wider than the first and second controllable switching devices 19. An apparatus, comprising:
   means for receiving a signal;
   means for alternating current (AC) buffering coupled to the means for receiving, the means for AC buffering having an output;

means for direct current (DC) buffering coupled to the means for receiving;

means for inverting the output of the means for AC buffering coupled to the output of the means for AC buffering;

means for latching the output of the means for AC buffering coupled to the output of the means for AC buffering;

means for delaying a signal from the output of the means for AC buffering; and means for providing feedback to the output of the means for AC buffering, the means for providing feedback receiving a first input from the means for delaying and a second input from the means for DC buffering, and is configured to provide feedback based on the first input and the second input.

20. A method, comprising:

applying a signal to an alternating current (AC) buffer, the AC buffer having an output coupled to a node;

applying a signal to a direct current (DC) buffer;

producing an output signal based on a signal at the node;

latching the node;

delaying the signal from the node a predetermined amount of time as a delayed signal before applying the delayed signal to a feedback circuit;

applying an output of the DC buffer to the feedback circuit; and applying feedback to the node based on the delayed signal and the output of the DC buffer.

* * * * *